(12) United States Patent
Tsai et al.

(10) Patent No.: US 9,865,732 B2
(45) Date of Patent: *Jan. 9, 2018

(54) INTEGRATED CIRCUITS AND METHODS OF FORMING INTEGRATED CIRCUITS

(71) Applicant: TAIWAN SEMICONDUCTOR MANUFACTURING COMPANY, LTD., Hsinchu (TW)

(72) Inventors: Chun Hsiung Tsai, Xinpu Township (TW); Su-Hao Liu, Jhongpu Township (TW); Chien-Tai Chan, Hsinchu (TW); King-Yuen Wong, Hsinchu (TW); Chien-Chang Su, Kaohsiung (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 15/171,322

(22) Filed: Jun. 2, 2016

(65) Prior Publication Data

US 2016/0284845 A1    Sep. 29, 2016

Related U.S. Application Data

(60) Continuation of application No. 14/510,706, filed on Oct. 9, 2014, now Pat. No. 9,379,208, which is a
(Continued)

(51) Int. Cl.
*H01L 29/76* (2006.01)
*H01L 29/78* (2006.01)
(Continued)

(52) U.S. Cl.
CPC .... *H01L 29/7834* (2013.01); *H01L 21/26506* (2013.01); *H01L 29/0847* (2013.01);
(Continued)

(58) Field of Classification Search
CPC ............ H01L 29/0847; H01L 29/1083; H01L 29/66492; H01L 29/6653; H01L 29/66636;
(Continued)

(56) References Cited

U.S. PATENT DOCUMENTS 6,153,920 A    11/2000  Gossmann
6,297,115 B1   10/2001  Yu
(Continued)

*Primary Examiner* — Yosef Gebreyesus
(74) *Attorney, Agent, or Firm* — Hauptman Ham, LLP

(57) ABSTRACT

An integrated circuit includes a gate electrode and spacers along sidewalls of the gate electrode. The integrated circuit further includes a source/drain (S/D) region adjacent to the gate electrode. The S/D region includes a diffusion barrier structure at least partially in a recess of the substrate. The diffusion barrier structure includes an epitaxial layer having a first region and a second region. The first region is thinner than the second region, and the first region is misaligned with respect to the sidewalls of the gate electrode. The S/D region includes a doped silicon-containing structure over the diffusion barrier structure. The first region of the diffusion barrier structure is configured to partially prevent dopants of the doped silicon-containing structure from diffusing into the substrate. The second region of the diffusion barrier structure is configured to substantially completely prevent the dopants of the doped silicon-containing structure from diffusing into the substrate.

19 Claims, 15 Drawing Sheets

Related U.S. Application Data division of application No. 13/210,962, filed on Aug. 16, 2011, now Pat. No. 8,884,341.

(51) Int. Cl.

| | | |
|---|---|---|
| *H01L 21/265* | (2006.01) | |
| *H01L 29/66* | (2006.01) | |
| *H01L 29/08* | (2006.01) | |
| *H01L 29/10* | (2006.01) | |

(52) U.S. Cl.
CPC ...... *H01L 29/1083* (2013.01); *H01L 29/6653* (2013.01); *H01L 29/66492* (2013.01); *H01L 29/66636* (2013.01); *H01L 21/26586* (2013.01)

(58) Field of Classification Search
CPC ........... H01L 29/26506; H01L 29/7834; H01L 21/26506; H01L 21/26586
See application file for complete search history.

(56) References Cited

U.S. PATENT DOCUMENTS

| | | | |
|---|---|---|---|
| 7,314,804 B2 | 1/2008 | Lindert et al. | |
| 7,319,061 B2 | 1/2008 | Shibata et al. | |
| 7,927,989 B2 | 4/2011 | Zhang et al. | |
| 8,884,341 B2* | 11/2014 | Tsai .................. | H01L 21/26506 257/207 |
| 2003/0045039 A1 | 3/2003 | Shin et al. | |
| 2004/0061228 A1 | 4/2004 | Wieczorek | |
| 2005/0001270 A1 | 1/2005 | Esmark et al. | |
| 2005/0029560 A1 | 2/2005 | Wasshuber et al. | |
| 2005/0035455 A1* | 2/2005 | Hu ...................... | H01L 29/6656 257/758 |
| 2005/0184311 A1 | 8/2005 | Murthy et al. | |
| 2006/0138398 A1 | 6/2006 | Shimamune et al. | |
| 2006/0148220 A1 | 7/2006 | Lindert et al. | |
| 2006/0237746 A1 | 10/2006 | Orlowski et al. | |
| 2007/0037326 A1 | 2/2007 | Chen et al. | |
| 2007/0048907 A1 | 3/2007 | Lee et al. | |
| 2007/0054444 A1 | 3/2007 | Shibata | |
| 2007/0099388 A1 | 5/2007 | Jain | |
| 2007/0190731 A1 | 8/2007 | Chen et al. | |
| 2007/0232039 A1 | 10/2007 | Kubo | |
| 2008/0001170 A1* | 1/2008 | Lindert ............. | H01L 21/26506 257/190 |
| 2008/0001224 A1 | 1/2008 | Kinoshita et al. | |
| 2008/0132012 A1 | 6/2008 | Babcock | |
| 2008/0157119 A1* | 7/2008 | Tsai ..................... | H01L 29/165 257/190 |
| 2008/0265256 A1* | 10/2008 | Lin ..................... | H01L 29/665 257/70 |
| 2009/0045459 A1 | 2/2009 | Okabe | |
| 2009/0068810 A1 | 3/2009 | Tsai et al. | |
| 2009/0179280 A1 | 7/2009 | Kohli | |
| 2009/0206413 A1 | 8/2009 | Cabral, Jr. et al. | |
| 2009/0261349 A1* | 10/2009 | Lee ..................... | H01L 29/0847 257/77 |
| 2009/0273034 A1 | 11/2009 | Woon et al. | |
| 2010/0012988 A1 | 1/2010 | Yang | |
| 2010/0025771 A1 | 2/2010 | Hoentschel et al. | |
| 2010/0084744 A1 | 4/2010 | Zafiropoulo | |
| 2010/0148310 A1 | 6/2010 | Koo | |

* cited by examiner

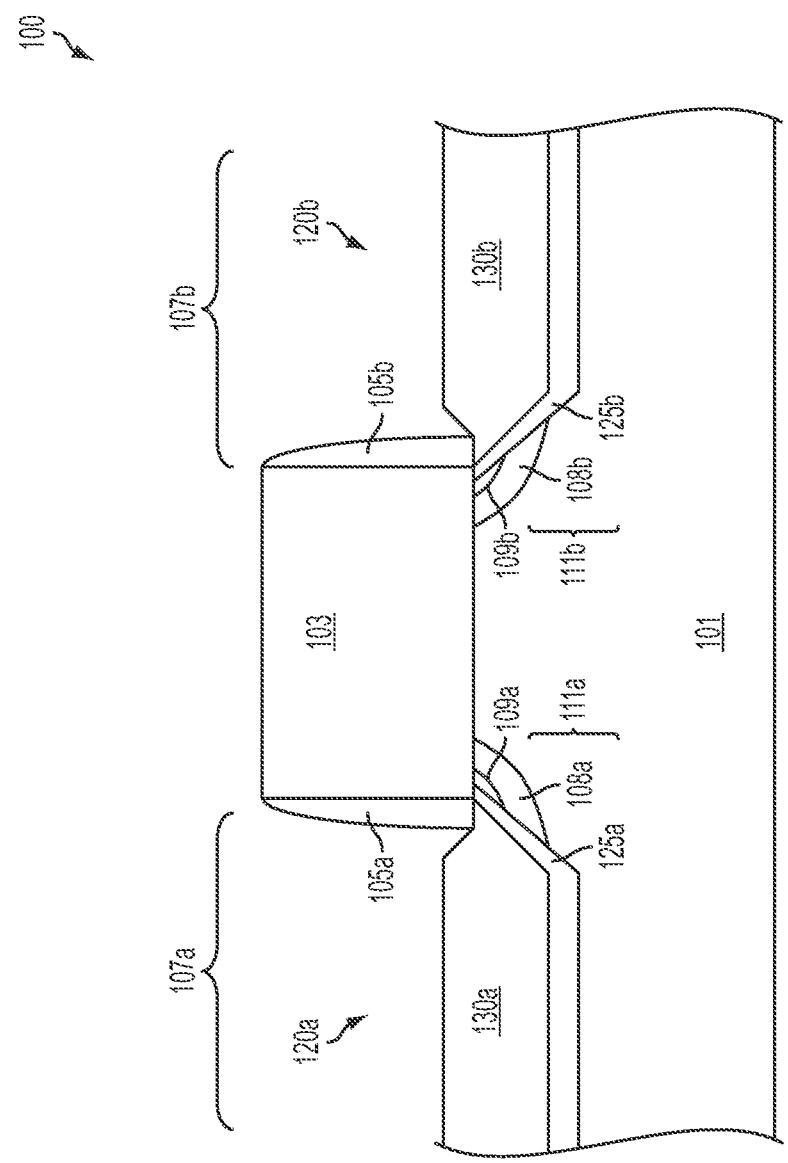

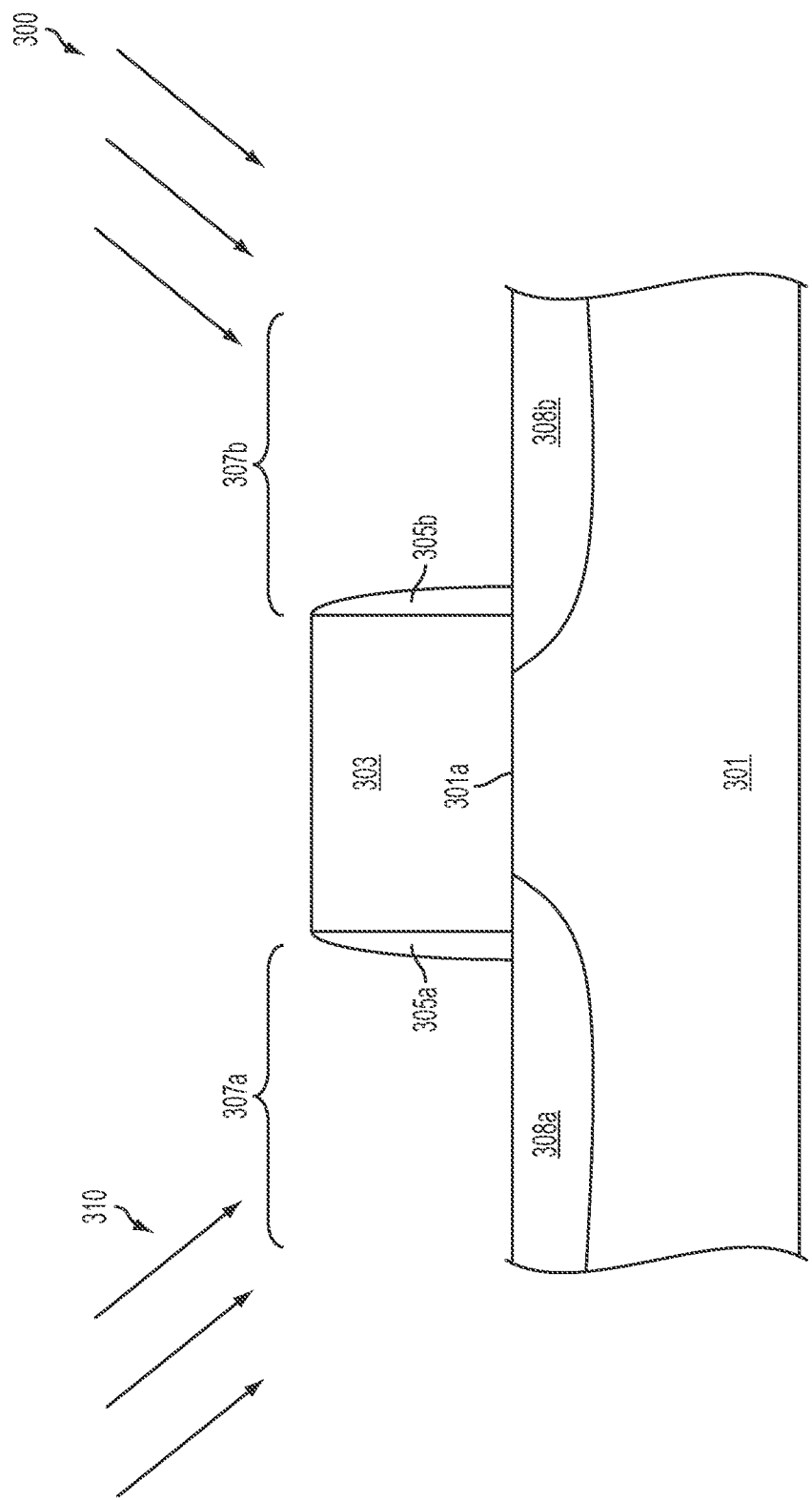

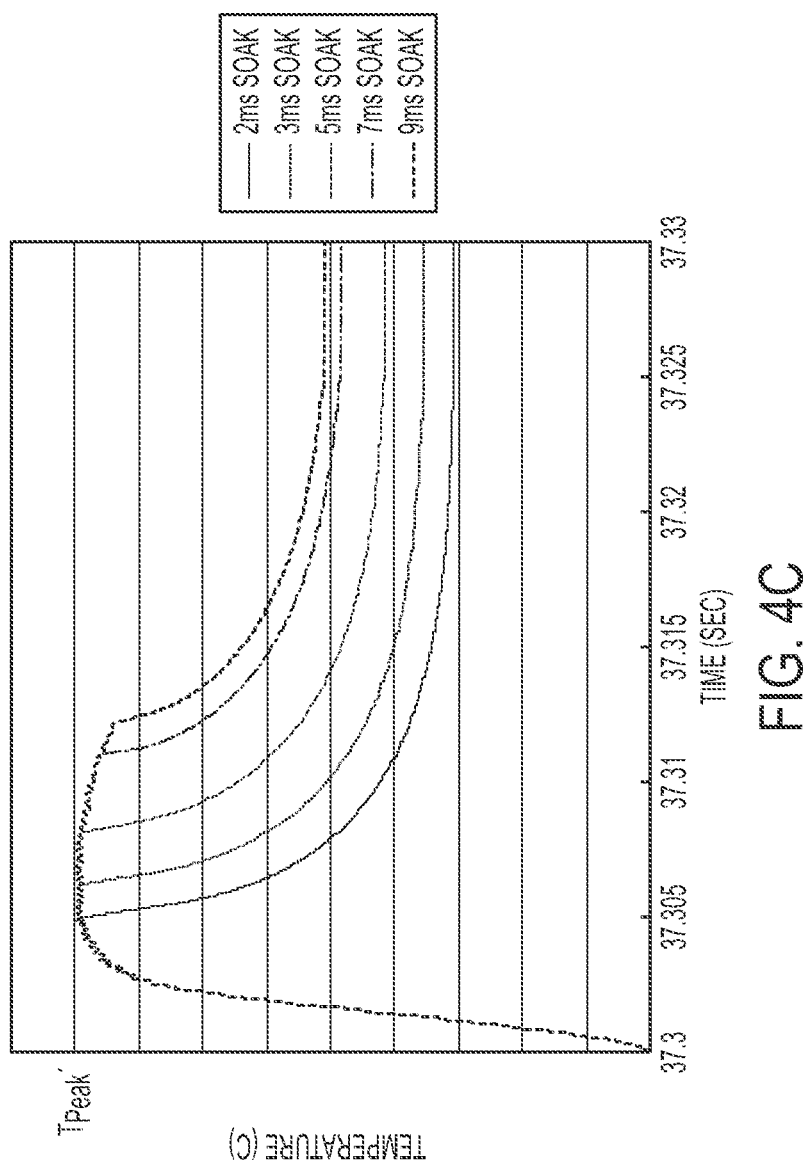

INTEGRATED CIRCUITS AND METHODS OF FORMING INTEGRATED CIRCUITS

PRIORITY CLAIM

The present application is a continuation of U.S. application Ser. No. 14/510,706, filed Oct. 9, 2014, which is a divisional of U.S. application Ser. No. 13/210,962, filed Aug. 16, 2011, now U.S. Pat. No. 8,884,341, issued Nov. 11, 2014, which are incorporated herein by reference in their entireties.

TECHNICAL FIELD

The present disclosure relates generally to the field of semiconductor devices and, more particularly, to integrated circuits and methods of forming the integrated circuits.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

FIG. 1A is a schematic cross-sectional view of an exemplary integrated circuit.

FIGS. 3A-3F are schematic cross-sectional views of an integrated circuit during various fabrication stages.

FIG. 4C is a magnified schematic drawing of an exemplary spike anneal of the anneal process shown in FIG. 4B.

DETAILED DESCRIPTION

Figure 1B:
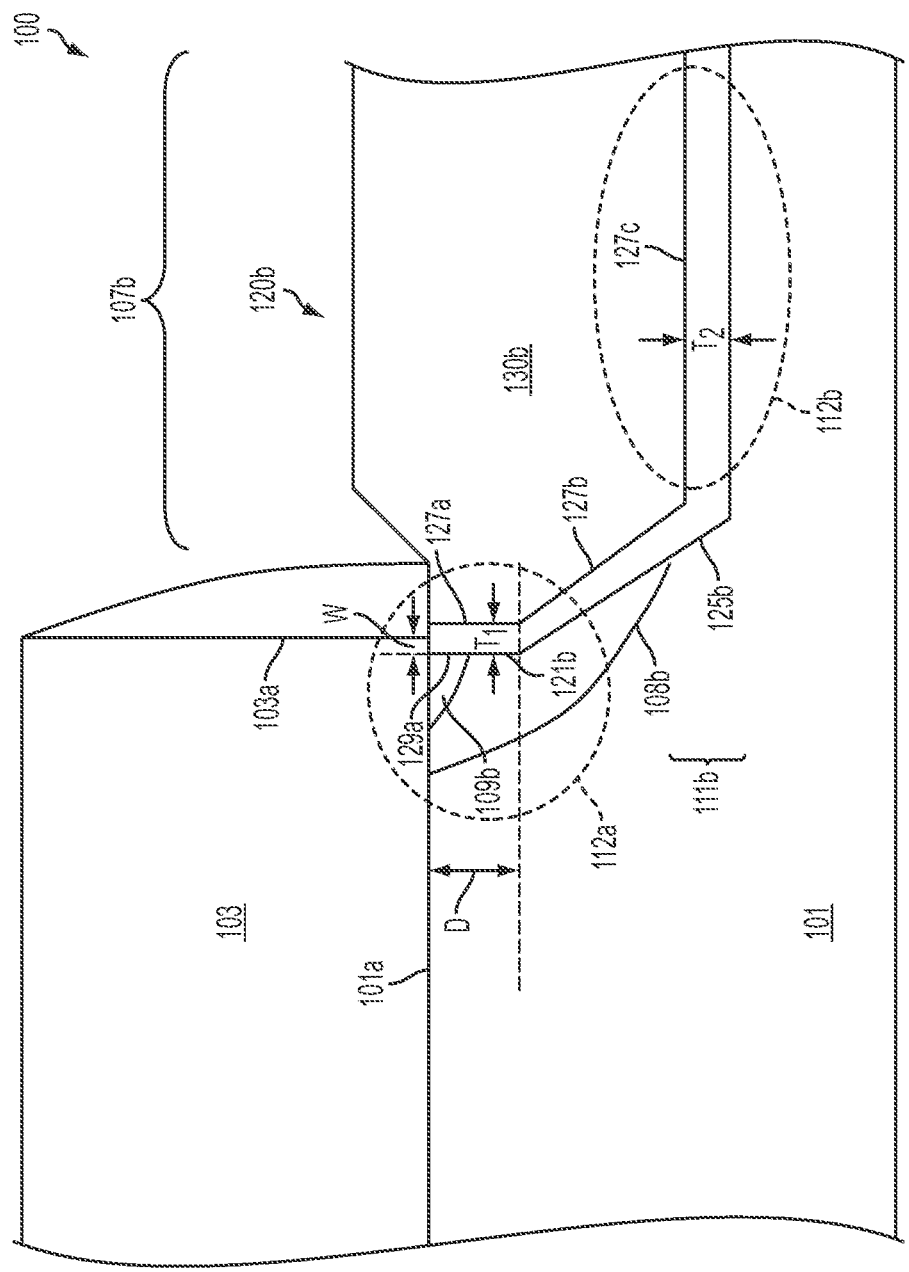
FIGS. 1B-1D are various magnified schematic cross-sectional views of a S/D region of an exemplary integrated circuit.

Generally, a plurality of ion implantations have been implemented for forming source/drain (S/D) regions, lightly-doped drain (LDD) regions, and pocket regions of transistors. For example, an N-type source/drain (NSD) process has a room-temperature phosphorus ion implantation that is provided to form a gradient dopant junction profile in a substrate. A room-temperature carbon ion implantation is then performed to the S/D regions to prevent over diffusion of phosphorus dopants into the substrate. A room-temperature arsenic ion implantation and a room-temperature phosphorus ion implantation are performed to form S/D doped regions. After the multiple ion implantations, a rapid thermal anneal (RTA) is performed to active dopants and cure damage resulting from the ion implantations. Silicide is then formed at the top of the S/D doped regions.

As noted, the process described above uses the room-temperature phosphorus ion implantation to form the junction profile. When transistors are scaled down, the S/D junction profile may be too deep. The multiple ion implantations may also substantially damage the S/D regions. To cure the damage, a high thermal budget, e.g., a higher RTA temperature of about 1050° C. and/or a longer RTA time, may be applied. The high thermal budget may aggravate a short-channel effect (SCE) within the transistors. If a low thermal budget is applied, implantation damage may not be desirably cured. The low thermal budget may also result in transient-enhanced diffusion (TED).

It is understood that the following descriptions provide many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one feature's relationship to another feature. The spatially relative terms are intended to cover different orientations of the device including the features.

FIG. 1A is a schematic cross-sectional view of an exemplary integrated circuit. In FIG. 1A, an integrated circuit 100 includes a gate electrode 103 that is disposed over a substrate 101. Source/drain regions 107a and 107b are adjacent to the gate electrode 103. In some embodiments, the integrated circuit 100 can be a digital circuit, an analog circuit, a mixed-signal circuit, a static random access memory (SRAM) circuit, an embedded SRAM circuit, dynamic random access memory (DRAM) circuit, an embedded DRAM circuit, a non-volatile memory circuit, e.g., FLASH, EPROM, E²PROME, a field-programmable gate circuit, or any combinations thereof.

In some embodiments forming an N-type transistor, the substrate 101 can be a silicon substrate doped with P-type dopants, such as boron (a P-type substrate). In other embodiments, the substrate 101 may alternatively be made of some other suitable elementary semiconductor, such as diamond or germanium; a suitable compound semiconductor, such as silicon carbide, silicon germanium, indium arsenide, or indium phosphide; or a suitable alloy semiconductor, such as silicon germanium carbide, gallium arsenic phosphide, or gallium indium phosphide. Further, the substrate 101 could include an epitaxial layer (epi layer), may be strained for performance enhancement, and may include a silicon-on-insulator (SOI) structure.

In some embodiments, the gate electrode 103 can be a conductive gate structure, e.g., a polysilicon gate structure, a metal gate structure, a dummy gate structure, or any suitable gate structure. For example, a conductive gate structure can have a stack structure including a gate dielectric layer, a conductive material layer, and/or other suitable layers. A metal gate structure can have a stack structure including a high dielectric constant gate layer, a diffusion barrier layer, a metal work function layer, a metallic layer, and/or other suitable layers. A dummy gate structure can have a stack structure including a dummy material layer, a hard mask layer, and/or other suitable layers.

Referring to FIG. 1A, spacers 105a and 105b are each disposed on respective sidewalls of the gate electrode 103. In some embodiments, the spacers 105a and 105b can be made of at least one material, such as silicon oxide, silicon nitride, silicon oxynitride, silicon carbide, silicon oxycarbide, silicon carbon nitride, other dielectric materials, and/or any combinations thereof.

Referring again to FIG. 1A, diffusion barrier structures 111a and 111b are disposed in recesses 120a and 120b of the substrate 101, respectively. N-type doped silicon-containing structures 130a and 130b are disposed over the diffusion barrier structures 111a and 111b, respectively. In some embodiments, the dopants concentration of the N-type doped silicon-containing structures 130a and 130b may range from about 2E20 cm$^{-3}$ to about 1E21 cm$^{-3}$.

Referring to FIG. 1A, the diffusion barrier structures 111a and 111b are configured to prevent N-type dopants, e.g., phosphorus, of the N-type doped silicon-containing structures 130a and 130b, respectively, from diffusing into the substrate 101. By controlling the diffusion of N-type dopants of the N-type doped silicon-containing structures 130a and 130b, the short channel effect of the transistor of the integrated circuit 100 can be reduced.

Referring to FIG. 1A, the diffusion barrier structures 111a and 111b include epitaxial carbon-containing layers 125a and 125b, respectively. In some embodiments, the epitaxial carbon-containing layers 125a and 125b can each have a carbon dopant concentration of about 0.1 atomic percent to about 1 atomic percent. In some embodiments, the epitaxial carbon-containing layers 125a and 125b can be made of at least one material, such as silicon carbide (SiC), silicon oxycarbide (SiOC), silicon carbon nitride (SiCN), silicon carbon phosphorus (SiCP), other carbon-containing materials, and/or any combinations thereof. With the carbon dopants, the epitaxial carbon-containing layers 125a and 125b can partially and/or completely reduce the diffusion of the N-type dopants of the N-type doped silicon-containing structures 130a and 130b into the substrate 101.

In some embodiments, the integrated circuit 100 optionally includes lightly-doped drains (LDDs) 109a and 109b. For the embodiments forming an N-type transistor, the LDDs 109a and 109b include n-type dopants, e.g., phosphorus and/or arsenic. The LDDs 109a and 109b are configured to reduce the resistance between the S/D regions 107a and 107b. In some embodiments, the LDDs 109a and 109b may enhance the short channel effect, if the channel length between the S/D regions 107a and 107b is shrunk to the order of nanometer.

Referring to FIG. 1A, the diffusion barrier structure 111a and 111b may optionally comprise carbon implanted regions 108a and 108b between the epitaxial carbon-containing layer 125a and 125b and the substrate 101, respectively. The carbon implanted regions 108a and 108b can reduce the diffusion of n-type dopants from the LDDs 109a and 109b into the channel of the transistor, such that the short channel effect can be reduced. In some embodiments, the carbon implanted regions 108a and 108b can have a carbon dopants concentration ranging from about 0.1 atomic percent to about 1 atomic percent.

It is noted that though showing both of the LDDs 109a-109b and the carbon implanted regions 108a-108b in FIG. 1A, the scope of this application is not limited thereto. In some embodiments, the carbon implanted regions 108a-108b are formed in the substrate 101, whereas the LDDs 109a-109b are skipped if the short channel effect outweighs the resistance between the S/D regions 107a and 107b. In other embodiments, the LDDs 109a-109b are formed in the substrate 101, whereas the carbon implanted regions 108a-108b are skipped, if the resistance outweighs the short channel effect.

FIG. 1B is an exemplary magnified schematic cross-sectional view of the S/D region 107b of the integrated circuit 100. In FIG. 1B, the diffusion barrier structure 111b includes portions 112a and 112b. The portion 112a is adjacent to the gate electrode 103 and close to the channel under the gate electrode 103. In contrast to the portion 112a, the portion 112b is distant from the gate electrode 103. The portion 112a of the diffusion barrier structure 111b is configured to partially prevent N-type dopants of the N-type doped silicon-containing structure 130b from diffusing into the substrate 101, e.g., the channel under the gate electrode 103. The partial diffusion of the N-type dopants of the N-type doped silicon-containing structure 130b into the channel reduces the resistance between the S/D regions 107a and 107b. The portion 112b of the diffusion barrier structure 111b is configured to substantially completely prevent N-type dopants of the N-type doped silicon-containing structure 130b from diffusing into the substrate 101.

In some embodiments to achieve different diffusion blocking effects in different regions, the epitaxial carbon-containing layers 125b of the diffusion barrier structure 111b includes regions 127a-127c. The region 127a is adjacent to the gate electrode 103 and the region 127c is distant from the gate electrode 103. As shown in FIG. 1B, the regions 127a and 127c have thicknesses $T_1$ and $T_2$, respectively. The thickness $T_1$ is smaller than the thickness $T_2$. In some embodiments, the thickness $T_1$ can range from about 2 nm to about 5 nm. The thickness $T_2$ can range from about 5 nm to about 15 nm. It is noted that the thickness ranges of the regions 127a and 127c are merely exemplary. In some embodiments, the thickness ranges may vary in response to the change of the technology node.

As noted, the region 127a is thinner than the region 127c. Due the thickness difference, the N-type dopants of the N-type doped silicon-containing structure 130b are partially blocked by the region 127a and substantially completely blocked by the region 127c. With the partial diffusion of the N-type dopants of the N-type doped silicon-containing structure 130b into the channel, the resistance between the S/D regions 107a and 107b is reduced. Also, because of the partial blocking of the N-type dopants of the N-type doped silicon-containing structure 130b into the channel, the short channel effect is controlled.

Referring to FIG. 1B, an interface 129a between the region 127a of the epitaxial carbon-containing layer 125b and the substrate 101 is directly under the gate electrode 103. In some embodiments, the interface 129a is misaligned from a sidewall 103a of the gate electrode 103 by a distance W. In some embodiments, the distance W is about 2 nm or less. It is noted that the distance W described above is merely exemplary. The scope of this application is not limited thereto. In some embodiments, the distance W may be larger depending on the change of the technology node.

As noted, the recess 120b may entrench under the gate electrode 103. The sidewall 121b of the recess 120b is directly under the gate electrode 103. The encroachment of the recess 120b under the gate electrode 103 may allow the N-type doped silicon-containing structure 130b to be formed close to the channel under the gate electrode 103. The closure of the N-type doped silicon-containing structure 130b to the channel reduces the resistance between the S/D regions 107a and 107b.

Figure 1C:
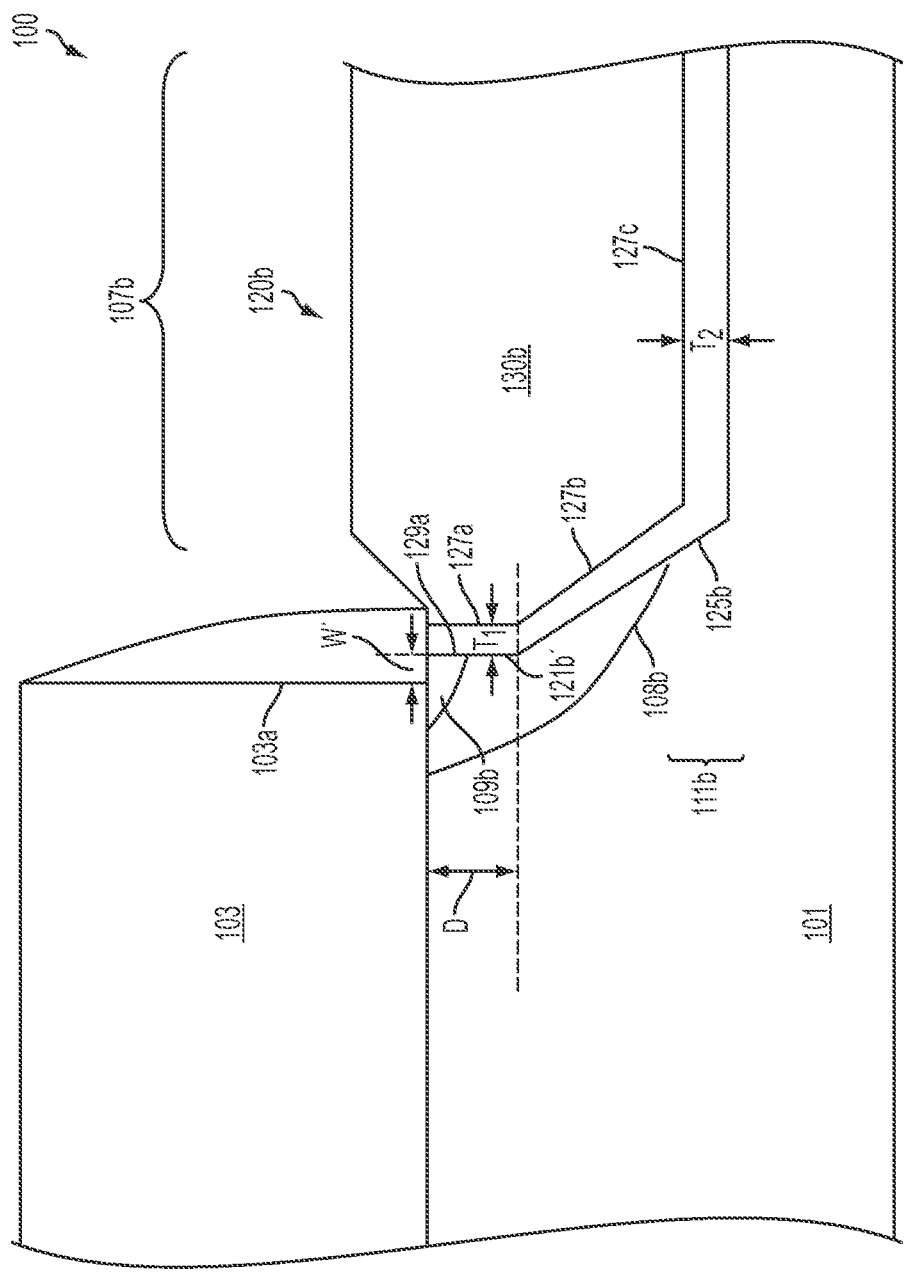

In other embodiments, an interface 129a' between the region 127a of the epitaxial carbon-containing layer 125b and the substrate 101 is not directly under the gate electrode 103 as shown in FIG. 1C. The sidewall 121b' of the recess 120b is not directly under the gate electrode 103. In some embodiments, the interface 129a' is misaligned from the sidewall 103a of the gate electrode 103 by a distance W'. In some embodiments, the distance W' is about 10 nm or less. It is noted that the distance W' described above is merely exemplary. The scope of this application is not limited thereto. In some embodiments, the distance W' may be larger depending on the change of the technology node.

As shown in FIG. 1C, the distance W' may keep the N-type doped silicon-containing structure 130b from the channel under the gate electrode 103. Compared with the structure shown in FIG. 1B, the remoteness of the N-type doped silicon-containing structure 130b to the channel may reduce the short channel effect.

Referring again to FIG. 1B, in some embodiments the region 127a of the epitaxial carbon-containing layer 125b continuously extends from a surface 101a of the substrate 101 along the sidewall 121b of the recess 120b for a depth D. In some embodiments, the depth D is about 7 nm or less. The region 127a may be substantially orthogonal to the surface 101a of the substrate 101. In other embodiments, the region 127a may tilt an angle with respect to the surface 101a and toward the region 127c.

Figure 1D:
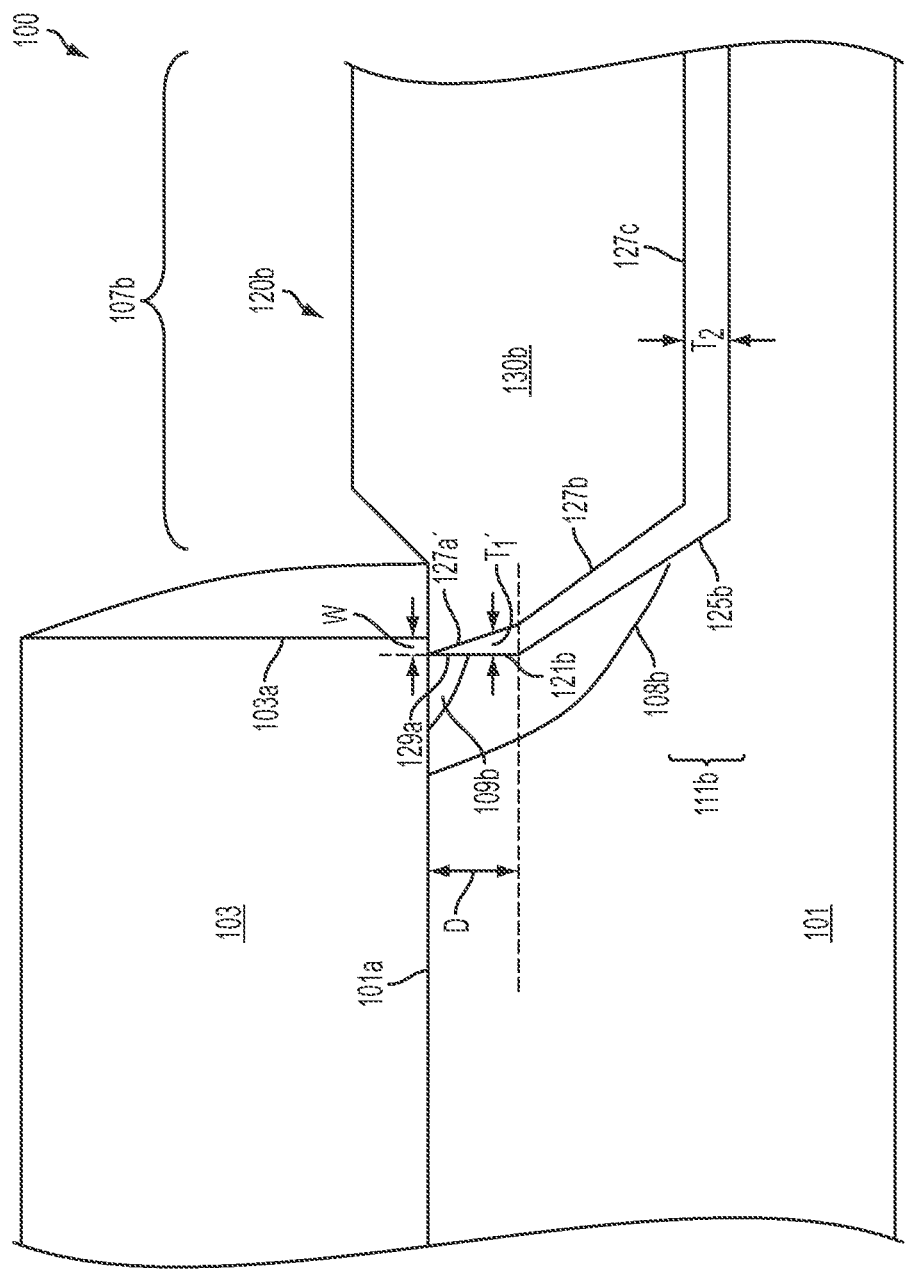

In some embodiments, the region 127a has a substantially conformal thickness along the sidewall 121b of the recess 120b as shown in FIG. 1B. In other embodiments, the thickness of the region 127a' gradually increases from the surface 101a of the substrate and along the sidewall of the recess 120b as shown in FIG. 1D. In FIG. 1D, the thickness $T_1'$ of the region 127a' is calibrated at the middle of the region 127a'.

Figure 2:
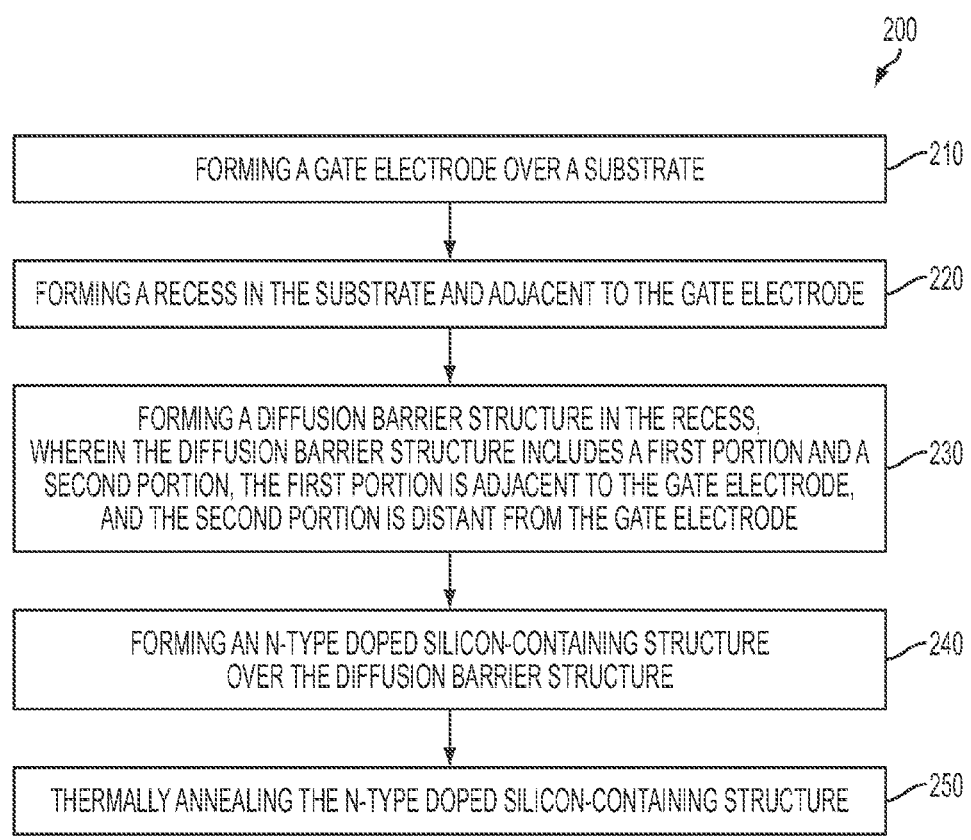
FIG. 2 is a flowchart of an exemplary method of forming an integrated circuit.

Following are descriptions of forming an exemplary integrated circuit. Illustrated in FIG. 2 is a flowchart of an exemplary method of forming an integrated circuit. FIGS. 3A-3F are schematic cross-sectional views of an integrated circuit during various fabrication stages. Items of FIGS. 3A-3F that are the same or similar items in FIG. 1A are indicated by the same reference numerals, increased by 200. It is understood that FIGS. 2 and 3A-3F have been simplified for a better understanding of the concepts of the present disclosure. Accordingly, it should be noted that additional processes may be provided before, during, and after the methods described in conjunction with FIGS. 2 and/or 3A-3F, and that some other processes may only be briefly described herein.

Referring now to FIG. 2, a method 200 of forming an integrated circuit includes forming a gate electrode over a substrate (block 210). A recess is formed in the substrate and adjacent to the gate electrode (block 220). A diffusion barrier structure is formed in the recess (block 230). The diffusion barrier structure includes a first portion and a second portion, the first portion is adjacent to the gate electrode, and the second portion is distant from the gate electrode. An N-type doped silicon-containing structure is formed over the diffusion barrier structure (block 240). The first portion of the diffusion barrier structure is configured to partially prevent N-type dopants of the N-type doped silicon-containing structure from diffusing into the substrate and the second portion of the diffusion barrier structure is configured to substantially completely prevent N-type dopants of the N-type doped silicon-containing structure from diffusing into the substrate. The method 200 includes thermally annealing the N-type doped silicon-containing structure (block 250).

Referring to FIG. 2, a gate electrode is formed over a substrate (block 210). For example, a gate electrode 303 can be formed over the substrate 301 as shown in FIG. 3A. Spacers 305a and 305b are formed on sidewalls of the gate electrode 303. S/D regions 307a and 307b are disposed adjacent to the sidewalls of the gate electrode 303.

In some embodiments, an implantation process 310 can implant carbon dopants into the substrate 301, forming carbon implanted regions 308a and 308b. In some embodiments, the implantation process 310 can have an implantation energy ranging from about 1 KeV to about 5 KeV, an implantation dosage ranging from about $5E14$ $cm^{-2}$ to about $2E15$ $cm^{-2}$, and an implantation tilt angle with respect to a direction orthogonal to the surface 301a of the substrate ranging from about 0° to about 25°. It is noted that the formation of the carbon implanted regions 308a and 308b is optional. The carbon implanted regions 308a and 308b are portions of diffusion barrier structures that will be described below.

In some embodiments using a gate-first process, the gate electrode 303 can include a polysilicon gate structure or a metal gate structure. For example, a conductive gate structure can have a stack structure including a gate dielectric layer, a conductive material layer, and/or other suitable layers. A metal gate structure can have a stack structure including a high dielectric constant gate layer, a diffusion barrier layer, a metal work function layer, a metallic layer, and/or other suitable layers.

In other embodiments using a gate-last process, the gate electrode 303 can include a dummy gate structure. The dummy gate structure can have a stack structure including a dummy material layer, a hard mask layer, and/or other suitable layers. The dummy gate structure will be removed after the formation of the S/D structures in the S/D regions 307a and 307b.

Figure 3B:
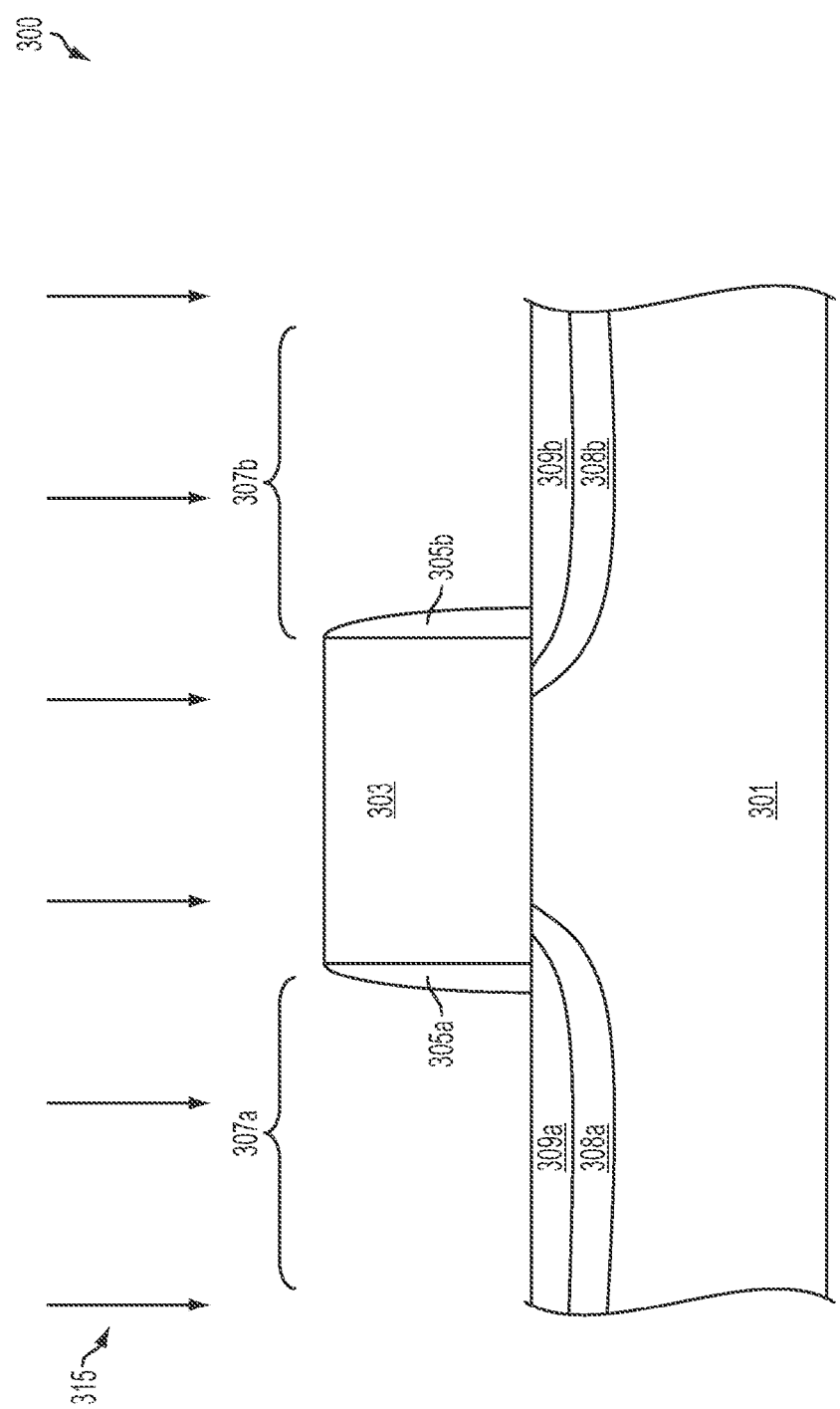

In some embodiments, another implantation process 315 can be optionally utilized to form lightly-doped drains (LDDs) 309a and 309b in the substrate 301 as shown in FIG. 3B. In some embodiments, portions of the LDDs 309a and 309b can be formed directly under the gate electrode 303. In other embodiments, the LDDs 309a and 309b are not covered by the gate electrode 303. The LDDs 309a and 309b can be formed of n-type dopants (impurities). For example, the dopants can comprise phosphorous, arsenic, and/or other group V elements. In some embodiments, at least one thermal annealing process, e.g., a rapid thermal annealing (RTA) process, can be performed to activate the dopants of the LDDs 309a and 309b. In some embodiments, the RTA process can have a spike annealing temperature of about 950° C.

Figure 3C:
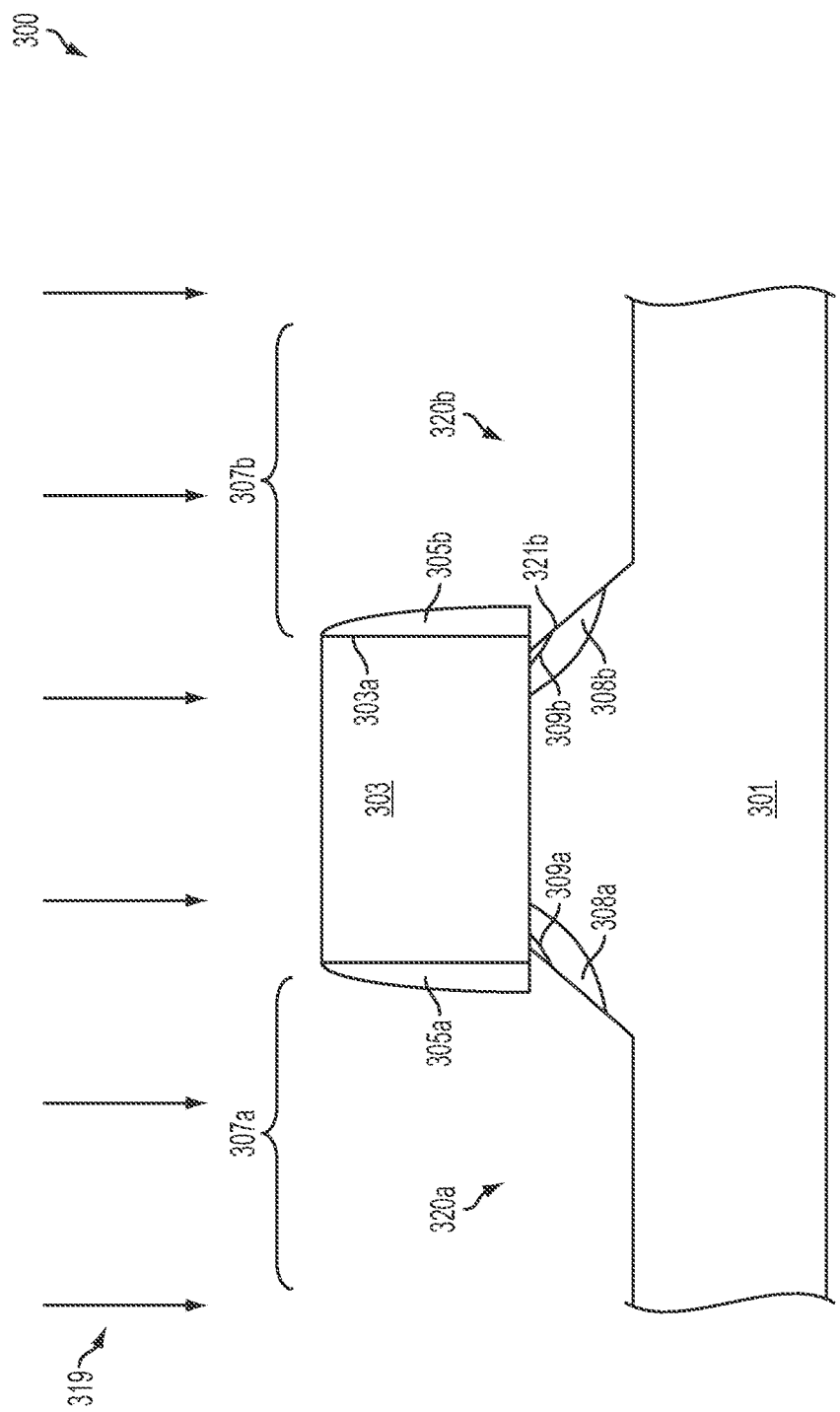

Referring to FIG. 2, a recess is formed in the substrate and adjacent to the gate electrode (block 220). For example, an etch process 319 removes portions of the substrate 301, forming recesses 320a and 320b in the substrate 301 as shown in FIG. 3C. The etch process 319 can include an isotropic etch process, an anisotropic etch process, and/or any combinations thereof.

In some embodiments using an isotropic etch process, the profiles of the recesses 320a and 320b can be achieved as shown in FIG. 3C. The magnified profiles of the recesses 320a and 320b can be the same as or similar to those described above in conjunction with FIGS. 1B-1D. In some embodiments, the sidewall 321b of the recess 320b can be the same as or similar to the sidewall 121b of the recess 120b describe above in conjunction with FIG. 1B. In at least this embodiment, the sidewall 321b of the recess 320b is directly under the gate electrode 303 and misaligned from a sidewall 303a of the gate electrode 303 by about 2 nm or less. In other embodiments, the sidewall 321b of the recess 320b can be the same as or similar to the sidewall 121b' of the recess 120b describe above in conjunction with FIG. 1C. In at least this embodiment, the sidewall 321b of the recess 320b is not directly under the gate electrode 303 and misaligned from a sidewall 303a of the gate electrode 303 by about 10 nm or less.

In other embodiments using an anisotropic etch process, the sidewall 321b of the recess 320b can be substantially orthogonal to the surface 301a of the substrate 301. As the sidewall 321b is used as an etch mask of the etch process 319, the sidewall 321b can be substantially aligned with the spacer 305b.

Figure 3D:
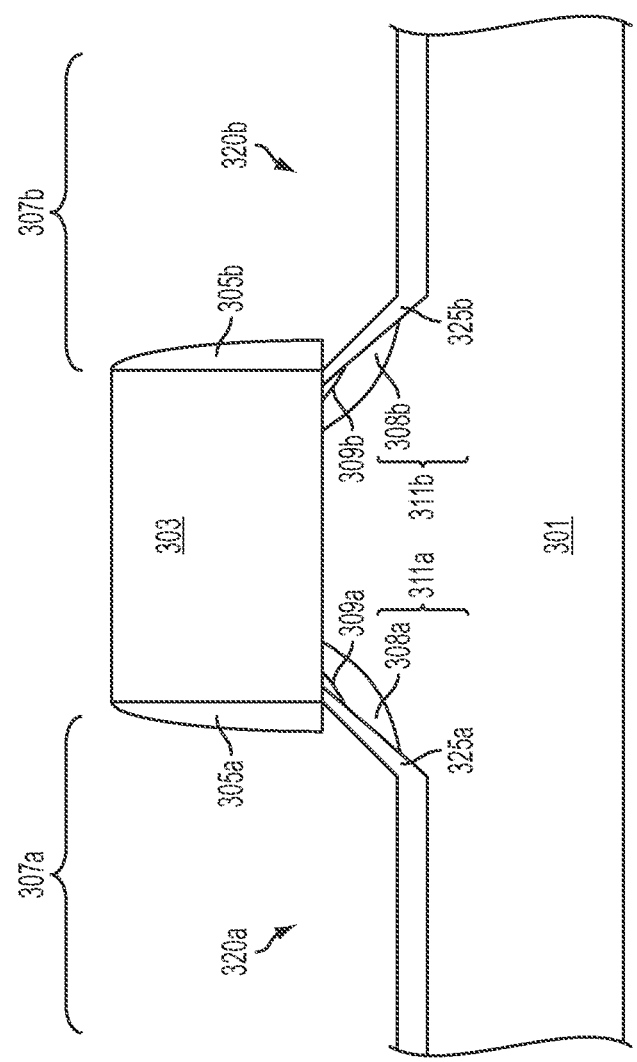

Referring again to FIG. 2, a diffusion barrier structure is formed in the recess (block 230). In some embodiments, the formation of the diffusion barrier structure includes epitaxially forming a carbon-containing layer in the recess. For example, carbon-containing layers 325a and 325b are epitaxially formed in the recesses 320a and 320b, respectively, as shown in FIG. 3D. The carbon-containing layers 325a and 325b each have a carbon concentration of about 0.1 atomic percent (%) to about 1 atomic percent. In some embodiments, the profile of the carbon-containing layers 325a and 325b can be the same as or similar to those described above in conjunction with FIGS. 1B-1D. For example, the diffusion barrier structure 111b includes portions 112a and 112b as described above in conjunction with FIG. 1B. The portion 112a is adjacent to the gate electrode 103 and the portion 112b is distant from the gate electrode 103.

In some embodiments, the carbon implanted regions 308a, 308b and the respective carbon-containing layers 325a, 325b can be referred to as diffusion barrier structures 311a and 311b, respectively. As noted, the carbon implanted regions 308a and 308b are optional. In other embodiments, the diffusion barrier structures 311a and 311b each only includes the respective carbon-containing layers 325a and 325b.

Figure 3E:
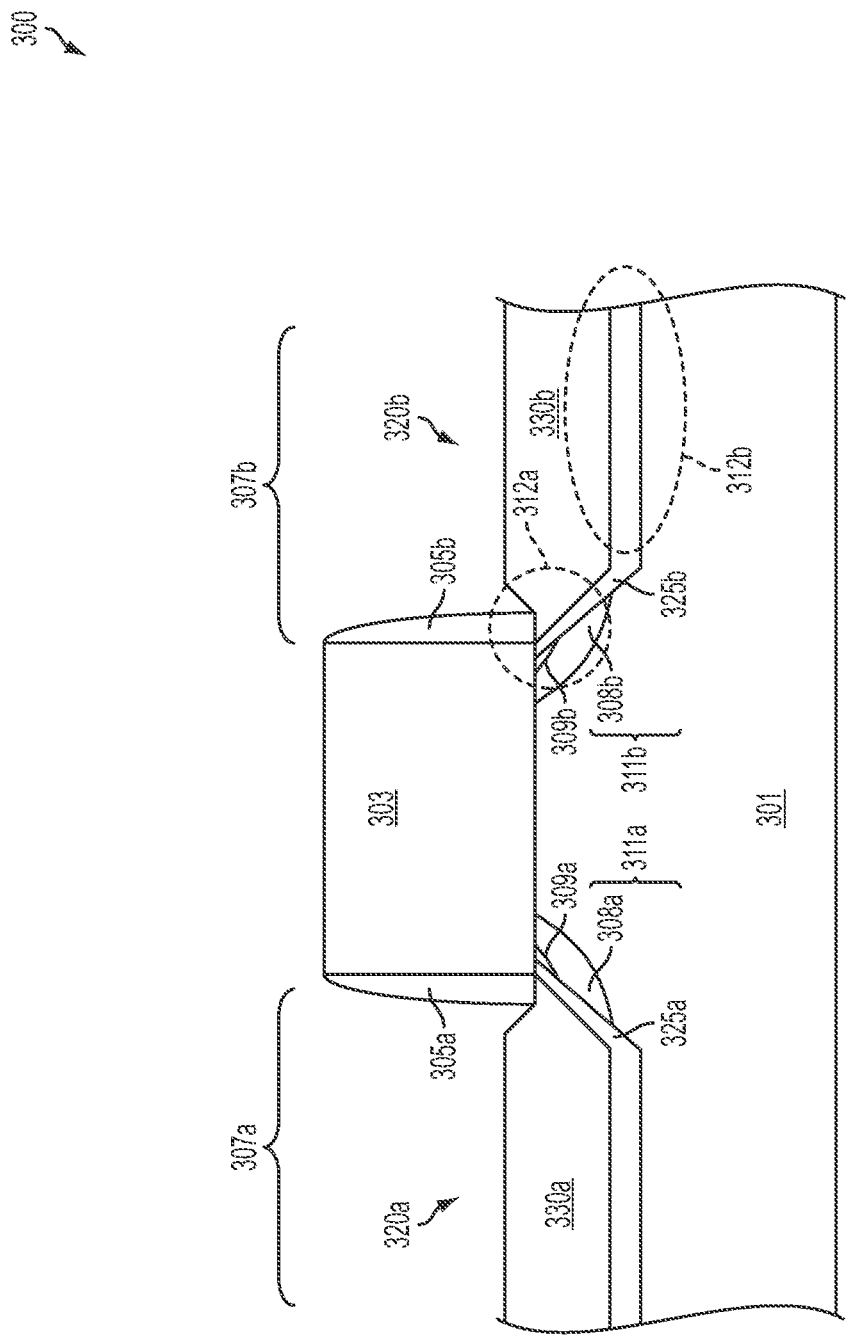

Referring to FIG. 2, an N-type doped silicon-containing structure is formed over the diffusion barrier structure (block 240). For example, N-type doped silicon-containing structures 330a and 330b are formed over the diffusion barrier structures 311a and 311b, respectively, as shown in FIG. 3E. The N-type doped silicon-containing structures 330a and 330b are referred to as heavily doped S/D regions. In some embodiments, the N-type doped silicon-containing structures 330a and 330b are epitaxially formed over the diffusion barrier structures 311a and 311b. The formation of the N-type doped silicon-containing structures 330a and 330b can utilize a cyclic deposition etch (CDE) process, a selective epitaxial growth (SEG) process, and/or any combinations thereof.

Applicants find that an implantation/anneal process for forming heavily doped S/D regions may activate dopants concentration up to about 2E20 cm$^{-3}$. Due to the restriction, the resistance at the heavily doped S/D regions may not be further reduced. Different from the implantation/anneal process, the N-type doped silicon-containing structures 330a and 330b are formed by an epitaxial process. N-type dopants can be in-situ doped during the epitaxial process and a higher dopant concentration can be achieved. In some embodiments, the N-type doped silicon-containing structure 330a and 330b each have a dopant concentration ranging from about 2E20 cm$^{-3}$ to about 1E21 cm$^{-3}$. By increasing the dopant concentration, the resistances of the N-type doped silicon-containing structure 330a and 330b are reduced. The "on" current of the transistor following through the N-type doped silicon-containing structure 330a and 330b is enhanced. In some embodiments, epitaxially forming the N-type doped silicon-containing structures 330a and 330b can be referred to as a concentration enhanced diffusion.

Applicants also find that the high dopant concentration of the N-type doped silicon-containing structure 330a and 330b may also aggravate the short channel effect due to dopant diffusion into the channel under the gate electrode 303. As noted, the diffusion barrier structures 311a and 311b are configured to partially and/or completely prevent dopant diffusion from the N-type doped silicon-containing structures 330a and 330b depending on the regions. The dopant diffusion blocking can reduce the short channel effect.

In some embodiments, the N-type doped silicon-containing structure 330b includes portions 312a and 312b as shown in FIG. 3E. The portion 312a is adjacent to the gate electrode 303 and the portion 312b is distant from the gate electrode 312b. The portion 312b of the diffusion barrier structure 325b is configured to substantially completely prevent N-type dopants of the N-type doped silicon-containing structure 330b from diffusing into the substrate 301. The portion 312a of the diffusion barrier structure 325b is configured to partially prevent N-type dopants of the N-type doped silicon-containing structure 330b from diffusing into the substrate 301. The partial diffusion of the N-type dopants through the diffusion barrier structure 325b reduces the resistance between the S/D regions 307a and 307b, while the short channel effect is controlled.

Figure 3F:
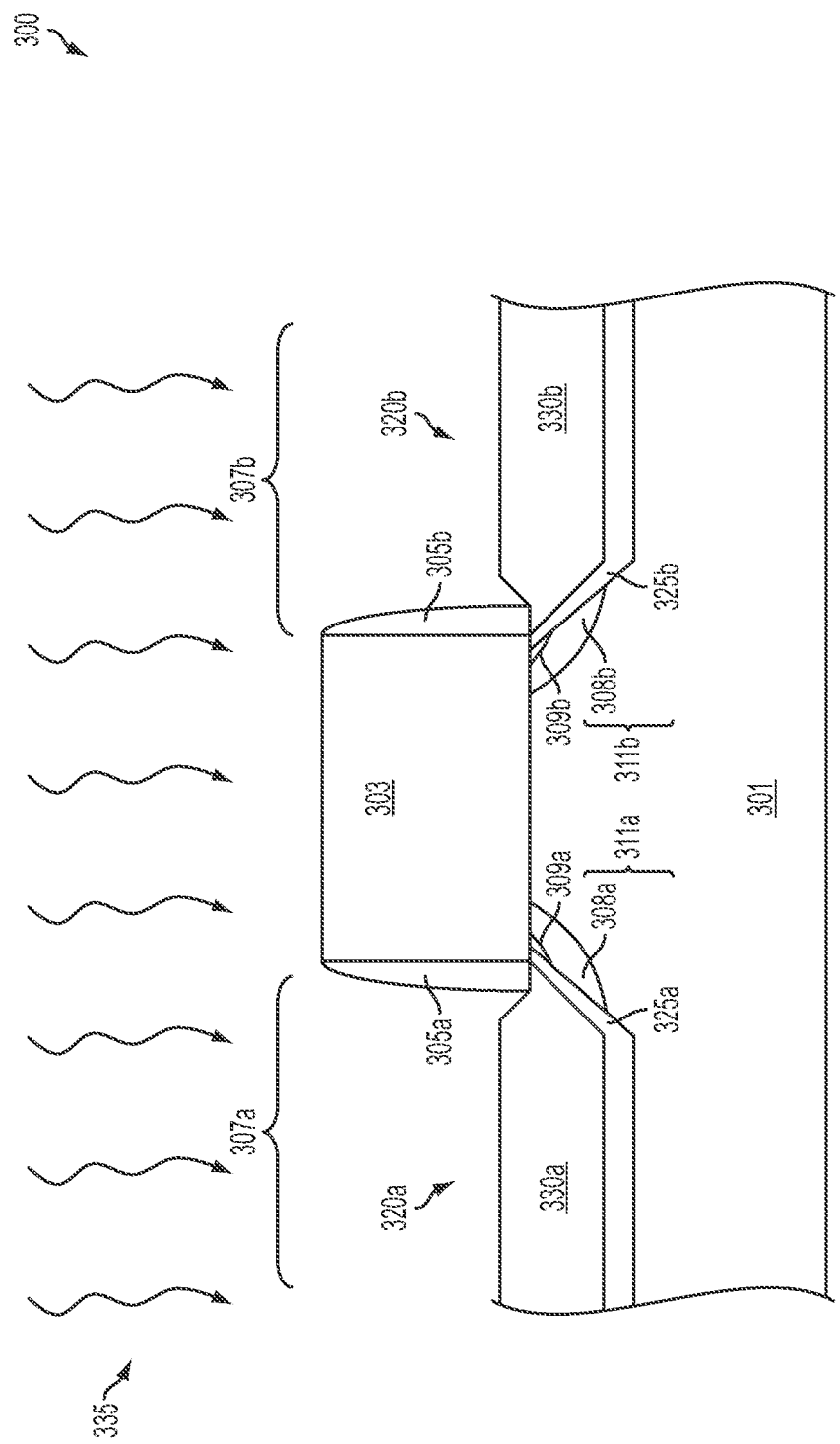

Referring again to FIG. 2, the method 200 includes thermally annealing the N-type doped silicon-containing region (block 250). For example, after the formation of the N-type doped silicon-containing structures 330a and 330b, a thermal process 335 is performed to activate N-type dopants of the N-type doped silicon-containing structures 330a and 330b as shown in FIG. 3F. Due to the high dopant concentration of the N-type doped silicon-containing structures 330a and 330b, the thermal process 335 is controlled such that the thermal budget does not substantially affect the dopant profile of the N-type doped silicon-containing structures 330a and 330b. The N-type dopants of the N-type doped silicon-containing structures 330a and 330b do not substantially diffuse into the channel under the gate electrode 303 and does not aggravate the short channel effect.

In some embodiments, the thermal process 335 may use a single or multiple preheat stages. Following the single or multiple preheat stages, a spike anneal is performed to activate the dopants of the N-type doped silicon-containing structures 330a and 330b.

Figure 4A:
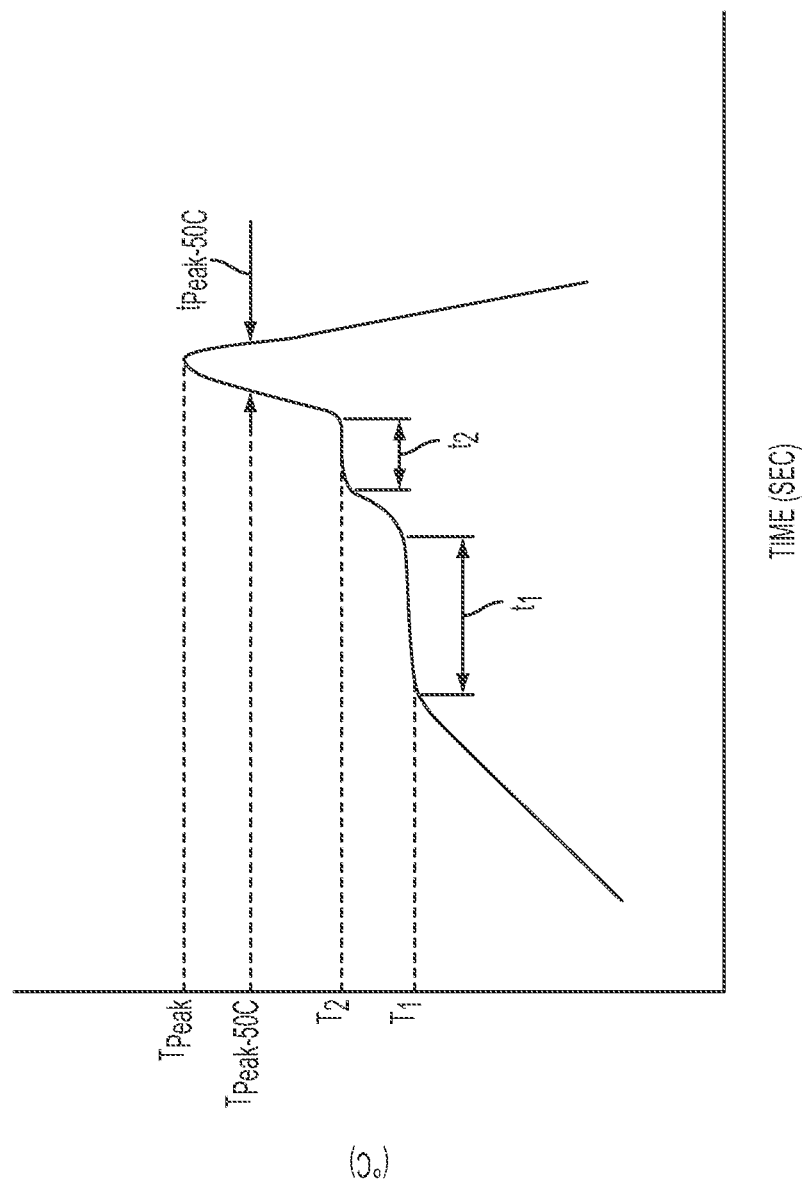
FIG. 4A is schematic drawing illustrating a thermal profile of an anneal process.

In some embodiments, the thermal process 335 uses a single preheat stage having a temperature ranging from about 550° C. to about 700° C. with a duration in a range from about 5 seconds to about 10 seconds. In other embodiments, the thermal process 335 uses multiple preheat stages, e.g., two preheat stages. In addition to the first preheat stage described above, a second preheat stage is performed to warm up the substrate. The second preheat stage can have a temperature ranging from about 500° C. to about 600° C. with a duration in a range from about 5 seconds to about 10 seconds. In some embodiments, the multiple preheat stages can be illustrated by a thermal profile including temperatures $T_1$, $T_2$ and durations $t_1$, $t_2$ as shown in FIG. 4A.

After the single or multiple preheat stages, the thermal process 335 includes a spike anneal stage. In some embodiments, the spike anneal stage can have an anneal spike temperature $T_{Peak}$ ranging from 875° C. to 990° C. The spike anneal stage can be performed with a temperature $T_{Peak-50C}$ ranging from 825° C. to 940° C. for a time duration $t_{Peak-50C}$ in a range from about 0.7 seconds to about 2.4 seconds. The temperature $T_{Peak-50C}$ means that the temperature is below a peak temperature $T_{Peak}$ by about 50° C. as shown in FIG. 4A. The time duration $t_{peak-50C}$ means the anneal time during the thermal process at temperature $T_{Peak-50C}$. As the spike anneal stage is performed for a timeframe on the order of the second level, the thermal process 335 described above in conjunction with FIG. 4A, in some embodiments, can be referred to as a rapid thermal process (RTP) spike anneal process.

Figure 4B:
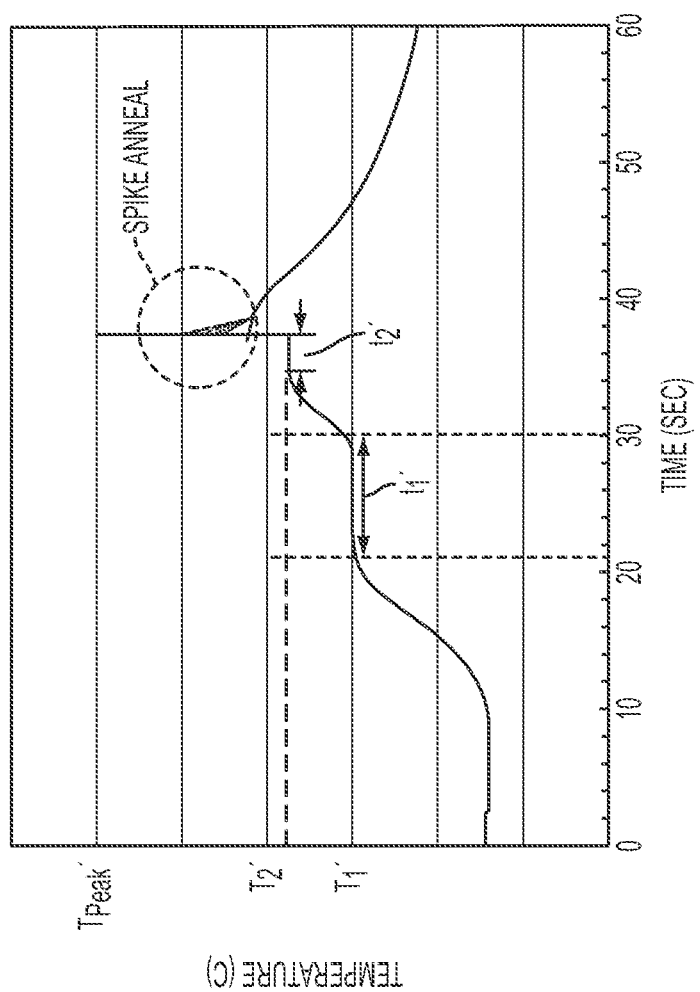
FIG. 4B is schematic drawing illustrating a thermal profile of another anneal process.

In other embodiments, the spike anneal stage can be performed for a timeframe on the order of the millisecond level. For example, the thermal process 335 includes multiple preheat stages, e.g., two preheat stages as shown in FIG. 4B. In some embodiments, the first preheat stage has a temperature $T_1'$ in a range from about 500° C. to about 800° C. with a duration $t_1'$ in a range from about 2 seconds to about 20 seconds. The second preheat stage has a temperature $T_2'$ in a range from about 500° C. to about 800° C. with a duration $t_2'$ in a range from about 2 seconds to about 20 seconds. After the second preheat stage, the anneal temperature is quickly raised to the peak anneal temperature $T_{Peak}'$ by millisecond anneal. The quick rise of the anneal temperature can be referred to as the spike anneal stage. In some embodiments, the spike anneal stage is referred to as a flash anneal. The spike anneal has the peak anneal temperature $T_{Peak}'$ ranging from about 1,000° C. to about 1,100° C. with a duration in a range from about 0.8 milliseconds to about 15 milliseconds. For example, FIG. 4C is a magnified drawing of the spike anneal shown in FIG. 4B. In FIG. 4C, the spike anneal stage includes one of temperature profiles of multiple millisecond anneal times (or soak times) from 2 ms, 3 ms, 5 ms, 7 ms and 9 ms.

It is noted if a conventional RTA process were applied to the structure shown in FIG. 3F, the dopants of the N-type doped silicon-containing structures 330a and 330b would have diffused into the channel under the gate electrode 303 and/or the substrate 301. The post-RTA dopant profile tails and is not parallel to the as-deposited dopant profile of the N-type doped silicon-containing structures 330a and 330b. The tail of the dopant profile devastates the short channel effect.

Contrary to the conventional RTA process, the thermal process 335 has the single or multiple preheat stages and a short duration spike anneal stage. The low thermal budget of the thermal process 335 substantially reduces the diffusion of the dopants of the N-type doped silicon-containing structures 330a and 330b into the channel under the gate electrode 303 and/or the substrate 301.

Figure 5:
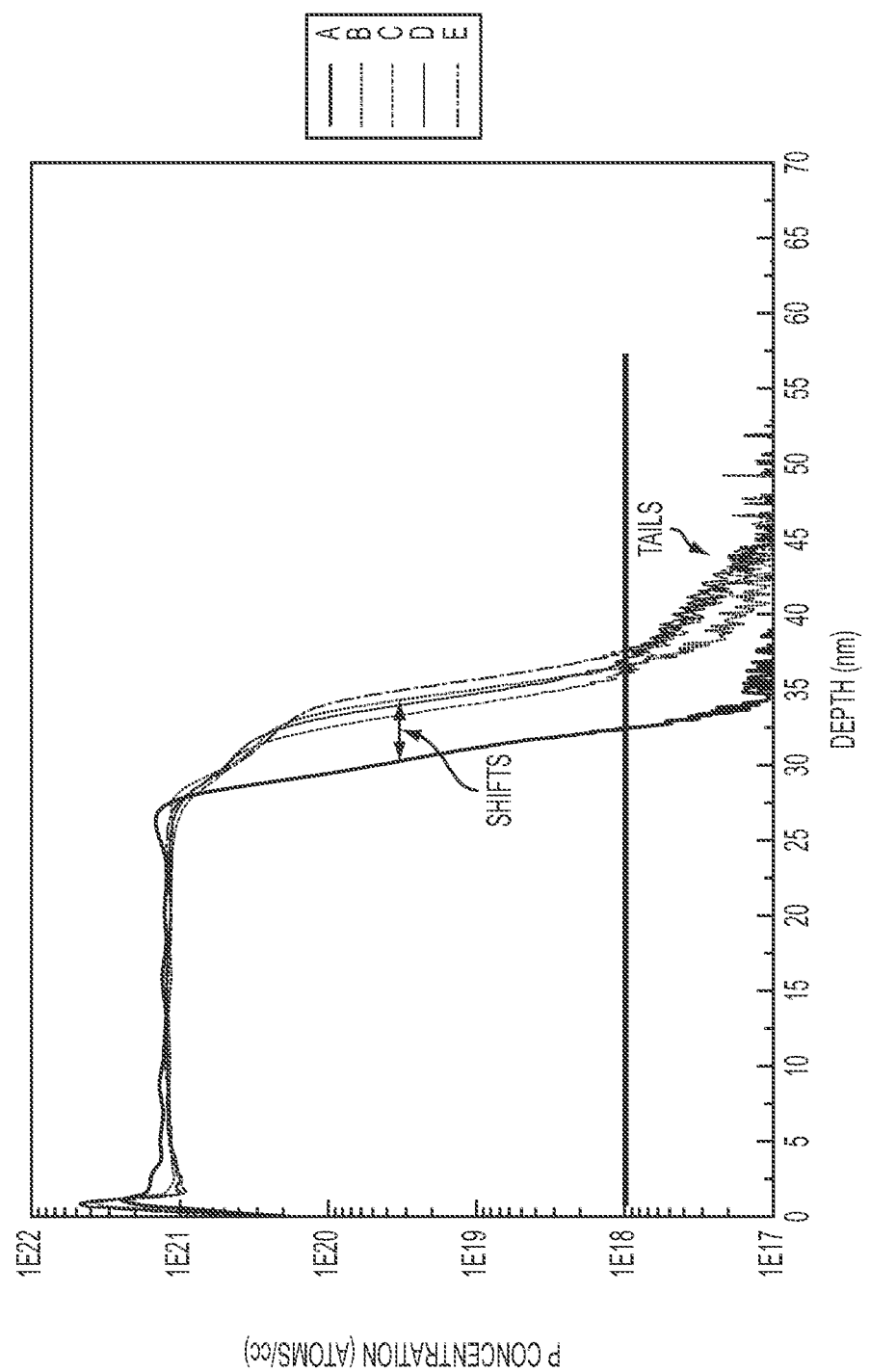
FIG. 5 is a schematic drawing showing secondary ion mass microscopy (SIMS) profiles S/D regions of integrated circuits processed by different conditions

For example, FIG. 5 is a schematic drawing showing secondary ion mass microscopy (SIMS) profiles S/D regions of integrated circuits processed by different conditions. In FIG. 5, samples A-E are prepared by the methods described above in conjunction with FIGS. 2 and 3A-3F. Samples A-E have the same thickness, e.g., about 30 nm, of the epitaxial N-type doped silicon-containing structures 330a and 330b, but have different carbon concentrations and thicknesses of carbon-containing layers 325a and 325b, and different thermal processes 335.

Referring to FIG. 5, sample A includes the epitaxial N-type doped silicon-containing structures 330a and 330b not subjected to the thermal process 335. Sample A has the carbon-containing layers 325a and 325b having a thickness of about 2 nm and carbon concentration of about 0.7%.

Samples B-D have the structures that are the same as Sample A. Samples B-D are subjected to different thermal processes. Sample B is subjected to two preheat stages and a second level spike anneal stage at a temperature of about 900° C. Sample C is subjected to two preheat stages and a second level spike anneal stage at a temperature of about 950° C. Sample D is subjected to a single preheat stage at a temperature of about 800° C. and a millisecond level spike anneal stage at a temperature of about 1050° C.

Sample E has the carbon-containing layers 325a and 325b having a thickness of about 3 nm and carbon concentration of about 0.3%. Sample E is then subjected to a single preheat stage at a temperature of about 800° C. and a millisecond level spike anneal stage at a temperature of about 1050° C.

As shown in FIG. 5, after different thermal processes the SIMS profiles of samples B-E are parallel-shifted with respect to the SIMS profile of sample A by a small distance. The parallel shift means the thermal budgets of the thermal processes applied to samples B-E substantially reduce the dopant diffusion from the N-type doped silicon-containing structures 330a and 330b. Though the SIMS profiles of samples B-E tail below the dopant concentration 1E18 $cm^{-3}$, the tails of the dopant profiles do not substantially affect the short channel effect.

As noted, the method 200 described above in conjunction with FIG. 2 can be a gate-last process. In some embodiments using the gate-last process, the method 200 can include a gate replacing process. The gate electrode 303 is a dummy gate structure. The dummy gate structure includes a hard mask material formed over a dummy gate material. The dummy gate material can be made of at least one material such as polysilicon, amorphous silicon, silicon oxide, silicon nitride, or a material having an etching rate that is substantially different from the spacers.

After the formation of the N-type doped silicon-containing structures 330a and 330b described above in conjunction with FIG. 3F, the hard mask materials and the dummy gate materials can be removed, for example, by a wet etch process, a dry etch process, or any combinations thereof. After removing the dummy gate materials, the gate-last process can include forming gate electrode material within openings in which the dummy gate materials are disposed. In some embodiments, the gate electrode material can be a stack structure including a diffusion barrier layer, a metallic work function layer, a metallic conductive layer, and/or other suitable material layers.

In some embodiments, at least one high dielectric constant (high-k) layer (not shown) can be formed under the gate electrode material. The high-k dielectric layer can include high-k dielectric materials such as $HfO_2$, HfSiO, HfSiON, HfTaO, HfTiO, HfZrO, other suitable high-k dielectric materials, or any combinations thereof. In some embodiments, the high-k material may further be selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina alloy, other suitable materials, or any combinations thereof.

In some embodiments, the diffusion barrier can be configured to prevent metallic ions of the work function metal material from diffusing into the gate dielectric material. The diffusion barrier may comprise at least one material such as aluminum oxide, aluminum, aluminum nitride, titanium, titanium nitride (TiN), tantalum, tantalum nitride, other suitable material, and/or combinations thereof.

In some embodiments, the metallic work function layer can include at least one P-metal work function layer and/or at least one N-metal work function layer. The P-type work function materials can include compositions such as ruthenium, palladium, platinum, cobalt, nickel, and conductive metal oxides, and/or other suitable materials. The N-type metal materials can include compositions such as hafnium, zirconium, titanium, tantalum, aluminum, metal carbides (e.g., hafnium carbide, zirconium carbide, titanium carbide, aluminum carbide), aluminides, and/or other suitable materials. In some embodiments, the metallic conductive layer can be made of at least one material, such as aluminum, copper, Ti, TiN, TaN, Ta, TaC, TaSiN, W, WN, MoN, MOON, $RuO_2$, and/or other suitable materials.

In some embodiments, dielectric materials, contact plugs, via plugs, metallic regions, and/or metallic lines (not shown) can be formed over the gate electrode portions for interconnection. The dielectric layers may include materials such as silicon oxide, silicon nitride, silicon oxynitride, low-k dielectric material, ultra low-k dielectric material, or any combinations thereof. The via plugs, metallic regions, and/or metallic lines can include materials such as tungsten, aluminum, copper, titanium, tantalum, titanium nitride, tantalum nitride, nickel silicide, cobalt silicide, other proper conductive materials, and/or combinations thereof. The via plugs, metallic regions, and/or metallic lines can be formed by any suitable processes, such as deposition, photolithography, etching processes, and/or combinations thereof.

One aspect of this description relates to an integrated circuit. The integrated circuit includes a gate electrode over a substrate; and spacers along sidewalls of the gate electrode. The integrated circuit further includes a source/drain (S/D) region adjacent to the gate electrode. The S/D region includes a diffusion barrier structure at least partially in a recess of the substrate, wherein the diffusion barrier structure comprises an epitaxial layer, wherein the epitaxial layer comprises a first region and a second region, wherein the first region is thinner than the second region, and the first region is misaligned with respect to the sidewalls of the gate electrode. The S/D region further includes a doped silicon-containing structure over the diffusion barrier structure. The first region of the diffusion barrier structure is configured to partially prevent dopants of the doped silicon-containing structure from diffusing into the substrate and the second region of the diffusion barrier structure is configured to substantially completely prevent the dopants of the doped silicon-containing structure from diffusing into the substrate.

Another aspect of this description relates to an integrated circuit. The integrated circuit includes a gate electrode over a substrate; and a source/drain (S/D) region adjacent to the gate electrode. The S/D region includes a diffusion barrier structure at least partially in a recess of the substrate, wherein the diffusion barrier structure comprises an epitaxial layer, wherein the epitaxial layer comprises a first region and a second region, wherein the first region is thinner than the second region, and a first portion of the first region is below the gate electrode. The S/D region further includes a doped silicon-containing structure over the diffusion barrier structure. The first region of the diffusion barrier structure is configured to partially prevent dopants of the doped silicon-containing structure from diffusing into the substrate. The second region of the diffusion barrier structure is configured to substantially completely prevent the dopants of the doped silicon-containing structure from diffusing into the substrate.

Still another aspect of this description relates to an integrated circuit. The integrated circuit includes a gate electrode over a substrate; and spacers along sidewalls of the gate electrode. The integrated circuit further includes a source/drain (S/D) region adjacent to the gate electrode. The S/D region includes a diffusion barrier structure at least partially in a recess of the substrate, wherein the diffusion barrier structure comprises an epitaxial layer, wherein the epitaxial layer comprises a first region and a second region, wherein the first region is thinner than the second region, and a first portion of the first region under the spacers. The S/D region further includes a doped silicon-containing structure over the diffusion barrier structure. The first region of the diffusion barrier structure is configured to partially prevent dopants of the doped silicon-containing structure from diffusing into the substrate. The second region of the diffusion barrier structure is configured to substantially completely prevent the dopants of the doped silicon-containing structure from diffusing into the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
a gate electrode over a substrate;
spacers along sidewalls of the gate electrode; and
a source/drain (S/D) region adjacent to the gate electrode, the S/D region comprising:
a diffusion barrier structure at least partially in a recess of the substrate, wherein the diffusion barrier structure comprises an epitaxial layer extending underneath at least a portion of the spacers, the epitaxial layer comprises a first region and a second region, wherein the first region is thinner than the second region, and the first region is misaligned with respect to the sidewalls of the gate electrode; and a doped silicon-containing structure over the diffusion barrier structure, wherein the first region of the diffusion barrier structure is configured to partially prevent dopants of the doped silicon-containing structure from diffusing into the substrate and the second region of the diffusion barrier structure is configured to substantially completely prevent the dopants of the doped silicon-containing structure from diffusing into the substrate.

2. The integrated circuit of claim 1, wherein an inner sidewall of the first region is displaced from a plane along the sidewall of the gate electrode, and a displacement is in a direction parallel to a top surface of the substrate.

3. The integrated circuit of claim 2, wherein the inner sidewall of the first region is located closer to a center of the gate electrode than the plane along the sidewall of the gate electrode.

4. The integrated circuit of claim 2, wherein the inner sidewall of the first region is located farther from a center of the gate electrode than the plane along the sidewall of the gate electrode.

5. The integrated circuit of claim 2, wherein the inner sidewall is displaced from the plane along the sidewall of the gate electrode by a distance of 10 nanometers (nm) or less.

6. The integrated circuit of claim 2, wherein an outer sidewall of the first region is on an opposite side of the plane along the sidewall of the gate electrode than the inner sidewall.

7. The integrated circuit of claim 1, wherein a thickness of the first region is variable along a length of the first region.

8. The integrated circuit of claim 1, wherein a depth of the first region from a top surface of the substrate is 7 nm or less.

9. The integrated circuit of claim 1, wherein a thickness of the first region is constant along a length of the first region.

10. An integrated circuit comprising:
a gate electrode over a substrate; and
a source/drain (S/D) region adjacent to the gate electrode, the S/D region comprising:
a diffusion barrier structure at least partially in a recess of the substrate, wherein the diffusion barrier structure comprises an epitaxial layer, wherein the epitaxial layer comprises a first region and a second region, wherein the first region is thinner than the second region, and a first portion of the first region extends underneath the gate electrode; and a doped silicon-containing structure over the diffusion barrier structure, wherein the first region of the diffusion barrier structure is configured to partially prevent dopants of the doped silicon-containing structure from diffusing into the substrate and the second region of the diffusion barrier structure is configured to substantially completely prevent the dopants of the doped silicon-containing structure from diffusing into the substrate.

11. The integrated circuit of claim 10, wherein a second portion of the first region extends beyond the gate electrode.

12. The integrated circuit of claim 11, wherein the epitaxial layer comprises carbon.

13. The integrated circuit of claim 11, wherein an area of a top surface of the substrate contacting the first region is entirely under the gate electrode.

14. The integrated circuit of claim 11, wherein the first region has a variable thickness.

15. The integrated circuit of claim 11, wherein the doped-silicon containing structure contacts the first region.

16. An integrated circuit comprising:
a gate electrode over a substrate;
spacers along sidewalls of the gate electrode; and
a source/drain (S/D) region adjacent to the gate electrode, the S/D region comprising:
a diffusion barrier structure at least partially in a recess of the substrate, wherein the diffusion barrier structure comprises an epitaxial layer, wherein the epitaxial layer comprises a first region and a second region, wherein the first region is thinner than the second region, and a first portion of the first region under the spacers; and
a doped silicon-containing structure over the diffusion barrier structure, wherein the doped silicon-containing structure extends underneath at least a portion of the spacers, the first region of the diffusion barrier structure is configured to partially prevent dopants of the doped silicon-containing structure from diffusing into the substrate and the second region of the diffusion barrier structure is configured to substantially completely prevent the dopants of the doped silicon-containing structure from diffusing into the substrate.

17. The integrated circuit of claim 16, wherein a second portion of the first region is under the gate electrode.

18. The integrated circuit of claim 16, wherein an entirety of the first region is under the spacers.

19. The integrated circuit of claim 16, wherein the first region has a variable thickness.

* * * * *